(12) United States Patent
Leitgeb et al.

(10) Patent No.: US 12,463,124 B2
(45) Date of Patent: Nov. 4, 2025

(54) COMPONENT CARRIER WITH SURFACE MOUNTED COMPONENTS CONNECTED BY HIGH DENSITY CONNECTION REGION

(71) Applicant: AT&S Austria Technologie & Systemtechnik Aktiengesellschaft, Leoben (AT)

(72) Inventors: Markus Leitgeb, Trofaiach (AT); Gerhard Freydl, Leoben (AT)

(73) Assignee: AT&S Austria Technologie & Systemtechnik Aktiengesellschaft, Leoben (AU)

( * ) Notice: Subject to any disclaimer, the term of this patent is extended or adjusted under 35 U.S.C. 154(b) by 784 days.

(21) Appl. No.: 17/655,160

(22) Filed: Mar. 16, 2022

(65) Prior Publication Data

US 2023/0298987 A1     Sep. 21, 2023

(51) Int. Cl.
| | |
|---|---|
| *H01L 23/498* | (2006.01) |
| *H01L 21/48* | (2006.01) |
| *H01L 23/00* | (2006.01) |
| *H01L 25/00* | (2006.01) |
| *H01L 25/065* | (2023.01) |
| *H01L 25/18* | (2023.01) |

(52) U.S. Cl.
CPC .... *H01L 23/49838* (2013.01); *H01L 21/4853* (2013.01); *H01L 21/4857* (2013.01); *H01L 23/49822* (2013.01); *H01L 23/562* (2013.01); *H01L 24/16* (2013.01); *H01L 25/0655* (2013.01); *H01L 25/18* (2013.01); *H01L 25/50* (2013.01); *H01L 2224/16227* (2013.01); *H01L 2924/1431* (2013.01); *H01L 2924/1434* (2013.01); *H01L 2924/3511* (2013.01); *H01L 2924/35121* (2013.01)

(58) Field of Classification Search
None
See application file for complete search history.

(56) References Cited

U.S. PATENT DOCUMENTS

| 8,541,690 B2 | 9/2013 | Voraberger et al. |
|---|---|---|
| 11,178,761 B1 | 11/2021 | Cho et al. |
| 2015/0245485 A1 | 8/2015 | Takahashi et al. |
| 2018/0310419 A1 | 10/2018 | Grober et al. |
| 2019/0221447 A1 | 7/2019 | Chavali et al. |

(Continued)

FOREIGN PATENT DOCUMENTS

| EP | 2018666 B1 | 4/2011 |
|---|---|---|
| JP | 2020080353 A | 5/2020 |

OTHER PUBLICATIONS

Degroote, B.; European Search Report in Application 23160657.5; pp. 1-10; Dec. 19, 2023; European Patent Office, 80298, Munich, Germany.

*Primary Examiner* — Michael Jung
(74) *Attorney, Agent, or Firm* — Robert A. Blaha; Smith Tempel Blaha LLC

(57) ABSTRACT

A component carrier includes a stack with electrically conductive layer structures and at least one electrically insulating layer structure. The electrically conductive layer structures have a higher density connection region and a lower density connection region, and a first component and a second component which are surface-mounted on the stack. The first component and the second component are electrically coupled with each other by the higher density connection region.

19 Claims, 6 Drawing Sheets

(56) References Cited

U.S. PATENT DOCUMENTS

| | | | |
|---|---|---|---|
| 2021/0280517 A1* | 9/2021 | May | H01L 24/16 |
| 2022/0148954 A1* | 5/2022 | Huang | H01L 23/5384 |
| 2023/0087838 A1* | 3/2023 | Manepalli | H01L 23/5385 |
| | | | 438/126 |
| 2023/0187386 A1* | 6/2023 | Pietambaram | H01L 28/10 |
| | | | 257/531 |
| 2023/0260945 A1* | 8/2023 | Wu | H01L 24/32 |
| | | | 257/737 |

* cited by examiner

COMPONENT CARRIER WITH SURFACE MOUNTED COMPONENTS CONNECTED BY HIGH DENSITY CONNECTION REGION

TECHNICAL FIELD

The disclosure relates to a component carrier and to a method of manufacturing a component carrier.

Technological Background

In the context of growing product functionalities of component carriers equipped with one or more electronic components and increasing miniaturization of such components as well as a rising number of components to be mounted on or embedded in the component carriers such as printed circuit boards, increasingly more powerful array-like components or packages having several components are being employed, which have a plurality of contacts or connections, with ever smaller spacing between these contacts. Removal of heat generated by such components and the component carrier itself during operation becomes an increasing issue. At the same time, component carriers shall be mechanically robust and electrically reliable so as to be operable even under harsh conditions.

Efficiently electrically connecting components being surface mounted on a component carrier is however still a challenge.

SUMMARY

There may be a need for a component carrier with surface mounted component being manufacturable simply and with high reliability.

According to an exemplary embodiment of the invention, a component carrier is provided, wherein the component carrier comprises a stack comprising electrically conductive layer structures and at least one electrically insulating layer structure, wherein the electrically conductive layer structures comprise a higher density connection region (in particular one or more higher density connection regions) and a lower density connection region (in particular one or more lower density connection regions), and a first component and a second component which are surface-mounted on the stack, wherein the first component and the second component are electrically coupled with each other by the higher density connection region.

According to another exemplary embodiment of the invention, a method of manufacturing a component carrier is provided, wherein the method comprises providing a stack comprising electrically conductive layer structures and at least one electrically insulating layer structure, wherein the electrically conductive layer structures comprise a higher density connection region and a lower density connection region, surface-mounting a first component and a second component on the stack, and electrically coupling the first component and the second component with each other by the higher density connection region.

OVERVIEW OF EMBODIMENTS

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. A component carrier may comprise a laminated layer body, such as a laminated layer stack. In particular, a component carrier may be one of a printed circuit board, an organic interposer, and an IC (integrated circuit) substrate. A component carrier may also be a hybrid board combining different ones of the above-mentioned types of component carriers.

In the context of the present application, the term "stack" may particularly denote a flat or planar sheet-like body. For instance, the stack may be a layer stack, in particular a laminated layer stack or a laminate. Such a laminate may be formed by connecting a plurality of layer structures by the application of mechanical pressure and/or heat.

In the context of the present application, the term "layer structure" may particularly denote a continuous layer, a patterned layer or a plurality of non-consecutive islands within a common plane.

In the context of the present application, the term "component" may particularly denote a device or member, for instance fulfilling an electronic and/or a thermal task. For instance, the component may be an electronic component. Such an electronic component may be an active component such as a semiconductor chip comprising a semiconductor material, in particular as a primary or basic material. The semiconductor material may for instance be a type IV semiconductor such as silicon or germanium, or may be a type III-V semiconductor material such as gallium arsenide. In particular, the semiconductor component may be a semiconductor chip such as a naked die or a molded die. At least one integrated circuit element may be monolithically integrated in such a semiconductor chip.

In the context of the present application, the terms "higher density connection region" and "lower density connection region" may particularly denote different regions of a common layer stack having different densities of electrically conductive elements. The higher density connection region and the lower density connection region may be defined as different regions of a common stack, wherein a number of electrically conductive elements (in particular connection elements, trace elements and/or vertical through connections) of electrically conductive layer structures of the stack per volume or per area of the respective connection region is larger in the higher density connection region than in the lower density connection region. A density of electrically conductive elements may thus denote a number of electrically conductive elements per area or per volume. For example, a ratio between the density in the higher density connection region and the density in the lower density connection region may be at least 2, in particular at least 5, and preferably at least 10. Said electrically conductive elements may be for example electrically conductive trace elements, electrically conductive connection elements and/or electrically conductive vertical through connections.

In the context of the present application, the term "trace element" may particularly denote an elongate element of an electrically conductive layer structure. For instance, such an elongate element may be straight, curved and/or angled. An example of a trace element is a wiring. For instance, a trace element may interconnect connection elements, components, vertical through connections and/or other trace elements. For example, a trace element may extend within a horizontal plane. In the context of the present application, the term "connection element" may particularly denote a laminar element of an electrically conductive layer structure. For instance, such a laminar element may be flat or two-dimensional, such as a pad. However, a connection element may also be three-dimensional and/or may extend vertically, such as a pillar or cylinder. For instance, a connection element may contribute to a connection between stack and at least one component, in particular by forming part of the stack and being connected with another connection element of said component. For example, a connection element may also be connected to other connection elements, components, vertical through connections and/or trace elements. In the context of the present application, the term "vertical through connections" may denote electrically conductive elements connecting different electrically conductive layer structures of the stack in a vertical direction. Examples of vertical through connections are metallic vias or metallic pillars. The above-mentioned higher density connection region may have a larger number of electrically conductive elements per area or per volume than the lower density connection region.

According to exemplary embodiments of the invention, a component carrier, such as a printed circuit board (PCB) or an integrated circuit (IC) substrate, is provided which electrically coupled two or more surface mounted components (in particular semiconductor chips) with each other by a connection region of a layer stack which has a locally increased density of connection elements as compared with another region of said layer stack. Electronic components with high density of connection pads at their main surface which are to be connected to a surface of a layer stack of a component carrier can then be directly connected to a region of the layer stack at which a number of electrically conductive elements per volume or area is larger than in other regions of the stack. Advantageously, this may ensure to connect surface mounted components along a short electric path to thereby ensure a proper signal integrity. Consequently, low signal loss and high signal quality may be achieved. At the same time, the formation of the stack with integral portions in form of the higher density connection region and the lower density connection region may allow to comply with highly demanding performance requirements while simultaneously keeping the overall manufacturing effort at a reasonable level. On the one hand, the formation of the higher density connection region may ensure a proper connection of the components. On the other hand, the higher density connection region needs to be formed only where needed, and other regions of the stack may be manufactured with a lower connection density and hence with lower effort. To describe it briefly, an exemplary embodiment of the invention provides a high-density interconnection between different surface mounted components by generating a partial high density connection region in a layer stack for an in situ connection of said components. This can be accomplished by a local increase of the number of electrically conductive elements per volume or area (in particular a local increase of the line space ratio) specifically where the components are to be assembled by surface mounting. Such an approach may be advantageous, since no embedding effort is necessary, neither for said components nor for an inlay accomplishing a connection between said components. By integrally forming the higher density connection region and the lower density connection region as integral homogeneous portions of a common stack, the handing of separate component connecting members (such as bridge dies or interposer inlays) may be dispensable. The homogeneous stack properties (in particular in terms of their dielectric material) may therefore efficiently suppress artefacts such as delamination and warpage and may thereby increase the performance and the reliability of the component carrier. Also, the formation of undesired microcracks may be strongly reduced, since those may happen often at the interface region between insulating stack material and embedded component. Moreover, the yield may be high by omitting a chip first manufacturing process.

In the following, further exemplary embodiments of the manufacturing method and the component carrier will be explained.

As mentioned above, the two or more surface mounted components may be in particular semiconductor chips. For example, any of said components may be a die on an interposer on a substrate (i.e., a stack of a substrate, an interposer and a die). In particular, the interposer may be formed on panel level or on wafer level. In a wafer level embodiment, a redistribution layer may be created on a wafer by using wafer technologies. In a panel level embodiment, a redistribution layer may be created on a panel by using PCB and/or IC substrate technology.

As already mentioned, the first component and the second component may be surface mounted on the stack. Such a surface mounted component may be attached to an exterior main surface of the stack and may be connected here electrically and mechanically. Surface mounting of a component may simplify the manufacture of the component carrier and removal of heat from the surface mounted components during operation of the component carrier.

In an embodiment, a higher connection density of the higher density connection region compared with a lower connection density of the lower density connection region corresponds to a smaller line space ratio and/or a smaller line pitch of the higher density connection region compared to a higher line space ratio and/or a higher line pitch of the lower density connection region. The term "line space ratio" may denote a pair of characteristic dimensions of an electrically conductive trace element, i.e., a characteristic line width of one electrically conductive trace element and a characteristic distance between adjacent electrically conductive trace elements. The term "line pitch" may denote a sum of a broadness of a metal trace and a broad-ness of dielectric material. With the described design rule in terms of line space ratio and/or line pitch, the lower density connection region may be manufactured in a very simple way. In order to match with more demanding line space ratio and/or line pitch properties of the surface mounted components, the higher density connection region may have a value of the line space ratio and/or line pitch smaller than that of the lower density connection region. This combines a reasonable manufacturing effort with a reliable electric coupling between stack and the surface mounted components.

What concerns absolute values, a line pitch of the higher density connection region may be in a range from 0.4 µm to 10 µm. This may comply with the requirements of high-performance semiconductor chips. Correspondingly, a line pitch of the lower density connection region may be in a range from 10 µm to 40 µm. This may be sufficient in a region of the stack apart from the connection between the surface mounted components.

What concerns relative values, a ratio between an average line width in the higher density connection region and in the lower density connection region may be in a range from 1/50 to 1/5, in particular in a range from 1/15 to 1/5. Said average line width may be averaged over all lines or traces in the respective connection region, i.e., in the lower density connection region or in the higher density connection region.

Correspondingly, a ratio between an average line space in the higher density connection region and in the lower density connection region may be in a range from 1/50 to 1/5, in particular in a range from 1/15 to 1/5. Said average line space may be averaged over all lines or traces in the respective connection region, i.e., in the lower density connection region or in the higher density connection region.

In an embodiment, at least one of the first component and the second component comprises a processor chip (for example a microprocessor or central processing unit, CPU). Additionally or alternatively, at least one of the first component and the second component may comprise a memory chip (for instance a high-bandwidth memory, HBM). It is also possible that a processor chip (as first component) and a corresponding memory chip (as second component) cooperate via the higher density connection region. Another advantageous combination is a processor chip and a sensor chip (for example a microphone). Still another appropriate application is the connection of a first processor chip with a second processor chip. Additionally or alternatively, it is also possible that any of the components is a passive component, such as a capacitive member.

However, many other examples for surface mounted components may be connected with each other by the higher density connection region of the stack. For instance, at least one of the at least one first component and the at least one second component comprises at least one of the group comprising a processor chip, a memory chip, a wafer level package, a bridge die (which may be used for interconnecting two other dies), stacked dies (i.e., a plurality of dies mounted on top of each other), a silicon photonics component, and an interposer (which may be a board being vertically sandwiched between two components to be interconnected by the interposer). The aforementioned interposer may for example be an active interposer. Two surface mounted components may be connected with each other by trace elements and by connection elements in the higher density connection region. For example, the surface mounted components may be connected with each other exclusively by the higher density connection region.

In an embodiment, the higher density connection region and the lower density connection region are homogeneously integrated within the same at least one electrically insulating layer structure of the stack. During manufacture of the component carrier, a plurality of dielectric layers may be connected with each other by lamination, i.e., the application of heat and/or pressure. Said dielectric layers may extend over the entire width of the component carrier and may therefore form part of both the higher density connection region and the lower density connection region. Thus, the dielectric material in the higher density connection region and in the lower density connection region may be the same, and may form part of the same electrically insulating layer structures. Such embodiments may be obtained when the higher density connection region and the lower density connection region are formed as a common build-up of laminated layers. As a consequence, the lower density connection region and the higher density connection region may be distinguishable from each other by a different electric connection density only, whereas material composition of higher density connection region and lower density connection region may be the same. A corresponding manufacturing process may be simple and fast, since processing stages for forming higher density connection region and lower density connection region may be carried out simultaneously.

In an embodiment, the lower density connection region and the higher density connection region are free of a dielectric interface in between. Such a dielectric interface may be a virtual surface in the three-dimensional space delimiting the higher density connection region with respect to the lower density connection region, wherein a change of the dielectric properties occurs at said virtual surface. Such a dielectric interface may be absent between higher density connection region and lower density connection region of a component carrier according to an exemplary embodiment of the invention. More specifically, the stack may have homogeneous or monolithic dielectric properties at a connection area between higher density connection region and lower density connection region. In particular, the stack may be free of an interface between a first dielectric material and another second dielectric material at a transition between higher density connection region and lower density connection region. More specifically, virtual sidewalls at a transition between higher density connection region and lower density connection region of the stack may have continuous or homogeneous properties concerning dielectric stack material. Thus, dielectric material bridges inside of the stack may be avoided. This may suppress, in turn, mismatch of the coefficient of thermal expansion (CTE) inside of the stack and may therefore reduce undesired phenomena such as warpage and delamination. In the described embodiment, the higher density connection region and the lower density connection region may be manufactured in a common process, rather than manufacturing the higher density connection region separately as an inlay which is then inserted into a cavity of the lower density connection region. Advantageously, handling of a separate inlay and forming of a cavity may be dispensable according to exemplary embodiments.

In an embodiment, the component carrier comprises a first set of first alignment marks assigned to the lower density connection region (in particular located directly below the lower density connection region). Correspondingly, the component carrier may comprise a second set of second alignment marks assigned to the higher density connection region (wherein said second alignment marks may be located for example on and/or underneath the higher density connection region). For instance, alignment marks may be structural features (such as holes or metallic dots in the stack) which can be detected for instance optically for ensuring a proper alignment between manufacturing tools and the stack during manufacture of the component carrier. In view of the locally different connection densities, also alignment during manufacturing the higher density connection region and during manufacturing the lower density connection region may be performed separately. To describe it briefly, alignment may be more critical and demanding in the higher density connection region than in the lower density connection region. By providing separate alignment marks for the lower density connection region and for the higher density connection region, it may be possible be properly align the high-density area to the low-density area. This can be simplified and rendered more precise by several alignment marks for both connection regions.

In an embodiment, the electrically conductive layer structures comprise connection elements in the higher density connection region and further connection elements in the lower density connection region, said connection elements being smaller than said further connection elements. Connection elements may be electrically conductive elements in the respective connection region which provide the function of electrically connecting the connection region with other constituents, in particular with a surface mounted component. For example, such connection elements may be pads. In particular, an average diameter and/or an average metallic volume of the connection elements in the higher density connection region may be smaller than an average diameter and/or an average metallic volume of the connection elements in the lower density connection region. In particular, different pad sizes may be provided in the different density areas, i.e., in the higher density connection region compared with the lower density connection region. For instance, an external electrically conductive layer structure of the higher density connection element may comprise external pads, and the lower density connection region may comprise further external pads, wherein the dimension of the pads is smaller than the dimension of the further pads. The mentioned pads and/or further pads may be provided on one main surface of the stack, or on both opposing main surfaces thereof. At least part of the pads may be connected, via an electrically conductive connection structure, with corresponding pads of the surface mounted components. Said electrically conductive connection structure may be for example solder structures, such as solder balls or solder paste. Alternatively, sinter structures, electrically conductive glue and/or metallic pillars (for example copper pillars) may be used for accomplishing such an electric connection.

In an embodiment, at least one of the first component and the second component may be surface mounted on the stack partially on the higher density connection region and partially on the lower density connection region. Preferably, at least one of the first component and the second component may be electrically coupled both with the higher density connection region and the lower density connection region. For instance, the respective first or second component may comprise at least one first pad being directly electrically connected with a corresponding electrically conductive connection element of the higher density connection region and may comprise at least one second pad being directly electrically connected with a corresponding electrically conductive connection element of the lower density connection region. This may allow to connect different surface portions of the respective component with different surface portions of the stack which belong partially to the higher density connection region and partially to the lower density connection region.

For example, connection elements of the higher density connection region and of the lower density connection region may differ only concerning a size within a horizontal plane, more particularly only along one direction or along two perpendicular directions of a horizontal plane. In a vertical direction along which the layer structures of the stack are layered and which may extend perpendicular to the horizontal plane, the connection elements of the higher density connection region and of the lower density connection region may be of the same size. This may simplify manufacture and electrical connection between higher density connection region and lower density connection region in the vertical direction. If spherical solder balls are applied, additional auxiliary electric connection elements (such as pads or pillars) may be added to overcome or compensate a height gap between solder balls of different radii. Smaller vias may be provided in the higher density connection region as well.

Preferably, connection elements of the lower density connection region may be used for power supply since, in view of the bigger lines, higher currents may flow through the metal structures. However, the connection elements of the higher density region may be preferably used for signal transfer. For signal transport, smaller lines are sufficient and advantageous. In particular, this may allow to safe space.

In an embodiment, at least part of said connection elements and/or at least part of said further connection elements extend up to an exterior main surface of the stack. In particular, said connection elements and said further connection elements may be coplanar and may thereby form together a connection plane for connecting the surface mounted components at the same vertical level. Different regions of said common connection plane may have different integration density.

In an embodiment, said higher density connection region extends up to an exterior main surface of the stack. Thus, the high-density area may form part of the main outer surface. The higher density connection region may have the same thickness as the lower density connection region or may have a smaller thickness. In the former case, the higher density connection region may extend between both opposing main surfaces of the stack. In the latter case, an even smaller partial volume of the stack may be constituted by the higher density connection region.

In an embodiment, the electrically conductive layer structures comprise parallel planar layer sections in the higher density connection region and parallel planar further layer sections in the lower density connection region, wherein at least one of said layer sections extends between two adjacent ones of said further layer sections in a stack thickness direction. For instance, said planar layer sections may be patterned metal foils (such as copper foils) or patterned deposited metal layers (for instance plated copper layers). Said planar layer sections may be structured so as to form trace elements (for instance wiring structures) and/or connection elements (such as pads). In the described embodiment, a number of parallel planar layer sections per thickness of a stack portion may be larger for the higher density connection region than for the lower density connection region. For instance, some of the planar layer sections of the higher density connection region and the lower density connection region may be in alignment with each other, wherein at least one additional planar layer section in the higher density connection region may be vertically interposed between two further planar layer sections in the lower density connection region. In other words, said at least one interposed additional planar layer section does not exist in the lower density connection region. For example, the stack comprises at least two electrically conductive layer structures, wherein said higher density connection region is provided parallel and between said at least two electrically conductive layer structures along a stack thickness direction.

In an embodiment, at least two of said layer sections extend between two of said further layer sections in the stack thickness direction. Hence, more than one additional layer section may be provided exclusively in the higher density connection region and may be both sandwiched between two other layer sections existing also in the lower density connection region and being adjacent layer structures there. Thus, there may be multiple additional planar structured metal layers in the higher density connection region, each one being arranged between two electrically conductive layer structures which are present both in the higher density connection region and in the lower density connection region.

In an embodiment, at least one of said layer sections extends, with respect to the stack thickness direction, at the same level as or below an exterior one of said further layer sections. Thus, the additional layer sections of the higher density connection region may be located inside of the stack.

In an embodiment, the higher density connection region comprises a redistribution structure. In the context of the present application, the term "redistribution structure" may particularly denote an arrangement of inter-connected patterned electrically conductive layers which have a portion with a lower pitch as compared to another portion with a higher pitch. Pitch may denote a characteristic distance between adjacent electrically conductive elements, such as trace elements and/or connection elements. By providing spatially separate portions of the higher density connection region with different pitch, a redistribution structure may form an electric interface between larger dimensioned electric connection elements and smaller dimensioned electric connection elements. In particular, a number of electrically conductive elements per area may be smaller in a portion with larger pitch than in another portion with smaller pitch.

In an embodiment, the higher density connection region has a substantially rectangular shape in a cross-sectional view (compare for example FIG. 1) and/or in a top view (compare for example FIG. 2). Said cross-sectional view may correspond to a cross-sectional plane including the vertical direction. In such a cross-sectional view, the higher density connection region may correspond to a substantially rectangular region extending up to a main surface of the stack and being partially surrounded by a lower density connection region having substantially a U-shape in the cross-sectional view.

In another embodiment, the higher density connection region has a substantially T-shape in a cross-sectional view (compare for example the top-sided higher density connection region according to FIG. 17). The horizontal leg of the "T" may extend along an exterior main surface of the stack, so that a relatively large surface area of said higher density connection region is exposed for providing a high connection area for the surface mounted components. Advantageously, such a T-shaped higher density connection region may be used as a fan-out structure.

In an embodiment, the component carrier comprises a further higher density connection region being spatially separated from the higher density connection region. In other words, two or more different regions of the stack may be configured as higher density connection region with locally increased density of electrically conductive elements. For instance, plural higher density connection regions may be arranged side-by-side on the same main surface of the stack and being separated from each other with a portion of the lower density connection region.

In an embodiment, the further higher density connection region is spatially separated from the higher density connection region in a stack thickness direction. Additionally or alternatively to the previously described embodiment, it is thus possible that a plurality of higher density connection regions are formed on two opposing main surfaces of the stack. This may allow to further extend the high-density mounting area for surface mounted components to be electrically coupled with each other via a respective higher density connection region.

The stack may have a sheet (or plate) like design comprising two opposing main surfaces. The main surfaces may form the two largest surface areas of the stack. The main surfaces are connected by circumferential side walls. The thickness of a stack is defined by the distance between the two opposing main surfaces. The main surfaces may comprise functional sections, such as conductive traces or conductive interconnections with further elements, such as one or more integrated circuits (ICs).

In an embodiment, the electrically conductive layer structures in one or both of the higher density connection region and the lower density connection region comprise at least two electrically conductive elements spaced with respect to each other in a stack thickness direction, at least two electrically conductive elements spaced with respect to each other in a first lateral direction perpendicular to the stack thickness direction, and at least two electrically conductive elements spaced with respect to each other in a second lateral direction perpendicular to the stack thickness direction and perpendicular to the first lateral direction. Hence, a three-dimensional arrangement of electrically conductive elements may be provided in the higher density connection region and/or in the lower density connection region. In particular, the higher integration density of electrically conductive elements in the higher density connection region as compared to the lower density connection region may be present in any one of said three directions, in any pair of two of three of such directions, or in each of said three directions.

Still referring to the previously described embodiment, at least part of said electrically conductive elements is electrically connected with a respective other part of said electrically conductive elements in the stack thickness direction and/or in at least one of the first lateral direction and the second lateral direction. In particular, electrically conductive elements of the higher density connection region can be connected with electrically conductive elements of the lower density connection region along a horizontal connection path and/or along a vertical connection path.

In an embodiment, an average distance between adjacent ones of said electrically conductive elements in the first lateral direction is different from an average distance between adjacent ones of said electrically conductive elements in the second lateral direction and/or in the stack thickness direction. Additionally alternatively, an average distance between adjacent ones of said electrically conductive elements in the second lateral direction may be different from an average distance between adjacent ones of said electrically conductive elements in the stack thickness direction. It is also possible that an average distance between adjacent ones of said electrically conductive elements in the higher density connection region is smaller than an average distance between adjacent ones of said electrically conductive elements in the lower density connection region.

In embodiments, the higher density connection region may be formed by one or more trenched layers, for example Nanoimprint Lithography (NIL) layers. Manufacturing the higher density connection region with a very high number of electrically conductive elements per area or volume may be a challenge with conventional approaches. However, by using NIL technology for the manufacture of the higher density connection region or even of the electrically conductive layer structures both in the higher density connection region and in the lower density connection region, even very small dimensions can be realized in a simple way. For example, a corresponding manufacturing method may comprise stamping a surface profile in a dielectric design layer, and subsequently forming an electrically conductive structure in indentations of the stamped design layer. Stamping a surface profile in the design layer may denote the process of imprinting or embossing a predefined surface pattern in the design layer. For instance, this may be accomplished by pressing a working mold (or working stamp) in the (in particular still) deformable design layer or by guiding a working mold along the (in particular still) deformable design layer. Preferably, the design layer may be made of an NIL material. The design layer may be cured. The design layer may or may not form part of the readily manufactured component carrier.

While NIL technology may be highly appropriate for forming the higher density connection region, is also possible to form the higher density connection region by other processes. For instance, manufacturing processes such as laser grooving, processing photoimageable dielectrics (PID), printing and/or additive processing (for instance three-dimensional printing) may be possible for creating the higher density connection region.

For manufacturing a component carrier according to an exemplary embodiment of the invention, it is for example possible to carry out subtractive processes (such as chemical and/or physical etching processes using proper masks) for creating the lower density connection region. Advantageously, additive processes (such as modified semi additive processing, mSAP, or semi additive processing, SAP) and/or a nanoimprint lithography (NIL) process may be preferably used to manufacture the higher density connection region. Additionally and/or alternatively, a subtractive process may be used for processing the higher density connection region, and vice versa additive processes may be used for processing the lower density connection region. For creating a higher density connection region, also a trenching process (for instance using a photo process, a plasma etching process, a laser process) may be used as well.

All of the stated manufacturing processes of the higher density connection region(s) can also be used for the lower density connection region(s), and vice versa. However, subtractive processes (such as applying a mask on a metal layer followed by an etching process (for instance a physical or chemical etching process) may be used in addition.

In an embodiment, the electrically insulating material may be different in the higher density connection region higher compared with the lower density connection region. By taking this measure, one or more physical parameters (such as the coefficient of thermal expansion, the value of the Young modulus, etc.) may be adjusted differently in the higher density connection region as compared to the lower density connection region, despite of the fact that both connection regions may form integral parts of a common stack.

For instance, the higher density connection region may be connected to an outer main surface of the stack. This exposes the higher density connection regions for direct connection with the surface mounted components.

In an embodiment, the higher density connection region has the same thickness or a smaller thickness than the stack. Thus, the higher density connection region may extend through the entire stack or only through part thereof.

In an embodiment, the component carrier is configured as a chiplet. Such a chiplet may be an integrated circuit block that has been specifically designed to work with other similar chiplets to form larger more complex component carrier-type modules. In such modules, a system may be subdivided into functional circuit blocks, i.e., said chiplets, that may be made of reusable blocks.

Exemplary applications of exemplary embodiments of the invention are high-performance electronics applications, for instance applications concerning high-performance computing. Advantageously, a high-density connection region integrated in a stack next to a low-density connection region integrated in the same stack may allow to reduce connection effort, for instance the provision of a separate silicon interposer.

In an embodiment, the stack comprises at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact.

In an embodiment, the component carrier is shaped as a plate. This contributes to the compact design, wherein the component carrier nevertheless provides a large basis for mounting components thereon. Furthermore, in particular a bare die as example for an embedded electronic component, can be conveniently embedded, thanks to its small thickness, into a thin plate such as a printed circuit board.

In an embodiment, the component carrier is configured as one of the group consisting of a printed circuit board, a substrate (in particular an IC substrate), and an interposer.

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming holes through the laminate, for instance by laser drilling or mechanical drilling, and by partially or fully filling them with electrically conductive material (in particular copper), thereby forming vias or any other through-hole connections. The filled hole either connects the whole stack, (through-hole connections extending through several layers or the entire stack), or the filled hole connects at least two electrically conductive layers, called via. Similarly, optical interconnections can be formed through individual layers of the stack in order to receive an electro-optical circuit board (EOCB). Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier. A substrate may be a, in relation to a PCB, comparably small component carrier onto which one or more components may be mounted and that may act as a connection medium between one or more chip(s) and a further PCB. For instance, a substrate may have substantially the same size as a component (in particular an electronic component) to be mounted thereon (for instance in case of a Chip Scale Package (CSP)). In another embodiment, the substrate may be substantially larger than the assigned component (for instance in a flip chip ball grid array, FCBGA, configuration) . More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical, thermal and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) and/or a photoimageable or dry-etchable organic material like epoxy-based build-up material (such as epoxy-based build-up film) or polymer compounds (which may or may not include photo- and/or thermosensitive molecules) like polyimide or polybenzoxazole.

In an embodiment, the at least one electrically insulating layer structure comprises at least one of the group consisting of a resin or a polymer, such as epoxy resin, cyanate ester resin, benzocyclobutene resin, bismaleimide-triazine resin, polyphenylene derivate (e.g., based on polyphenylenether, PPE), polyimide (PI), polyamide (PA), liquid crystal polymer (LCP), polytetrafluoroethylene (PTFE) and/or a combination thereof. Reinforcing structures such as webs, fibers, spheres or other kinds of filler particles, for example made of glass (multilayer glass) in order to form a composite, could be used as well. A semi-cured resin in combination with a reinforcing agent, e.g., fibers impregnated with the above-mentioned resins is called prepreg. These prepregs are often named after their properties, e.g., FR4 or FR5, which describe their flame retardant properties. Although prepreg particularly FR4 are usually preferred for rigid PCBs, other materials, in particular epoxy-based build-up materials (such as build-up films) or photoimageable dielectric materials, may be used as well. For high-frequency applications, high-frequency materials such as polytetrafluoroethylene, liquid crystal polymer and/or cyanate ester resins, may be preferred. Besides these polymers, low temperature cofired ceramics (LTCC) or other low, very low or ultra-low DK materials may be applied in the component carrier as electrically insulating structures.

In an embodiment, the at least one electrically conductive layer structure comprises at least one of the group consisting of copper, aluminum, nickel, silver, gold, palladium, tungsten, magnesium, carbon, (in particular doped) silicon, titanium, and platinum. Although copper is usually preferred, other materials or coated versions thereof are possible as well, in particular materials coated with supra-conductive material or conductive polymers, such as graphene or poly (3,4-ethylenedioxythiophene) (PEDOT), respectively.

At least one further component may be embedded in and/or surface mounted on the stack. The component and/or the at least one further component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. An inlay can be for instance a metal block, with or without an insulating material coating (IMS-inlay), which could be either embedded or surface mounted for the purpose of facilitating heat dissipation. Suitable materials are defined according to their thermal conductivity, which should be at least 2 W/mK. Such materials are often based, but not limited to metals, metal-oxides and/or ceramics as for instance copper, aluminum oxide ($Al_2O_3$) or aluminum nitride (AlN). In order to increase the heat exchange capacity, other geometries with increased surface area are frequently used as well. Furthermore, a component can be an active electronic component (having at least one p-n-junction implemented), a passive electronic component such as a resistor, an inductance, or capacitor, an electronic chip, a storage device (for instance a DRAM or another data memory), a filter, an integrated circuit (such as field-programmable gate array (FPGA), programmable array logic (PAL), generic array logic (GAL) and complex programmable logic devices (CPLDs)), a signal processing component, a power management component (such as a field-effect transistor (FET), metal-oxide-semiconductor field-effect transistor (MOSFET), complementary metal-oxide-semiconductor (CMOS), junction field-effect transistor (JFET), or insulated-gate field-effect transistor (IGFET), all based on semi-conductor materials such as silicon carbide (SIC), gallium arsenide (GaAs), gallium nitride (GaN), gallium oxide ($Ga_2O_3$), indium gallium arsenide (InGaAs), indium phosphide (InP) and/or any other suitable inorganic compound), an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be an IC substrate, an interposer or a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electro-magnetic radiation propagating from an environment, may be used as component.

In an embodiment, the component carrier is a laminate-type component carrier. In such an embodiment, the component carrier is a compound of multiple layer structures which are stacked and connected together by applying a pressing force and/or heat.

After processing interior layer structures of the component carrier, it is possible to cover (in particular by lamination) one or both opposing main surfaces of the processed layer structures symmetrically or asymmetrically with one or more further electrically insulating layer structures and/or electrically conductive layer structures. In other words, a build-up may be continued until a desired number of layers is obtained.

After having completed formation of a stack of electrically insulating layer structures and electrically conductive layer structures, it is possible to proceed with a surface treatment of the obtained layers structures or component carrier.

In particular, an electrically insulating solder resist may be applied to one or both opposing main surfaces of the layer stack or component carrier in terms of surface treatment. For instance, it is possible to form such a solder resist on an entire main surface and to subsequently pattern the layer of solder resist so as to expose one or more electrically conductive surface portions which shall be used for electrically coupling the component carrier to an electronic periphery. The surface portions of the component carrier remaining covered with solder resist may be efficiently protected against oxidation or corrosion, in particular surface portions containing copper.

It is also possible to apply a surface finish selectively to exposed electrically conductive surface portions of the component carrier in terms of surface treatment. Such a surface finish may be an electrically conductive cover material on exposed electrically conductive layer structures (such as pads, conductive tracks, etc., in particular comprising or consisting of copper) on a surface of a component carrier. If such exposed electrically conductive layer structures are left unprotected, then the exposed electrically conductive component carrier material (in particular copper) might oxidize, making the component carrier less reliable. A surface finish may then be formed for instance as an interface between a surface mounted component and the component carrier. The surface finish has the function to protect the exposed electrically conductive layer structures (in particular copper circuitry) and enable a joining process with one or more components, for instance by soldering. Examples for appropriate materials for a surface finish are Organic Solderability Preservative (OSP), Electroless Nickel Immersion Gold (ENIG), Electroless Nickel Immersion Palladium Immersion Gold (ENIPIG), Electroless Nickel Electroless Palladium Immersion Gold (ENEPIG), gold (in particular hard gold), chemical tin (chemical and electroplated), nickel-gold, nickel-palladium, etc. Also nickel-free materials for a surface finish may be used, in particular for high-speed applications. Examples are ISIG (Immersion Silver Immersion Gold), and EPAG (Electroless Palladium Autocatalytic Gold).

The aspects defined above and further aspects of the invention are apparent from the examples of embodiment to be described hereinafter and are explained with reference to these examples of embodiment.

DETAILED DESCRIPTION OF ILLUSTRATED EMBODIMENTS

Figure 1:
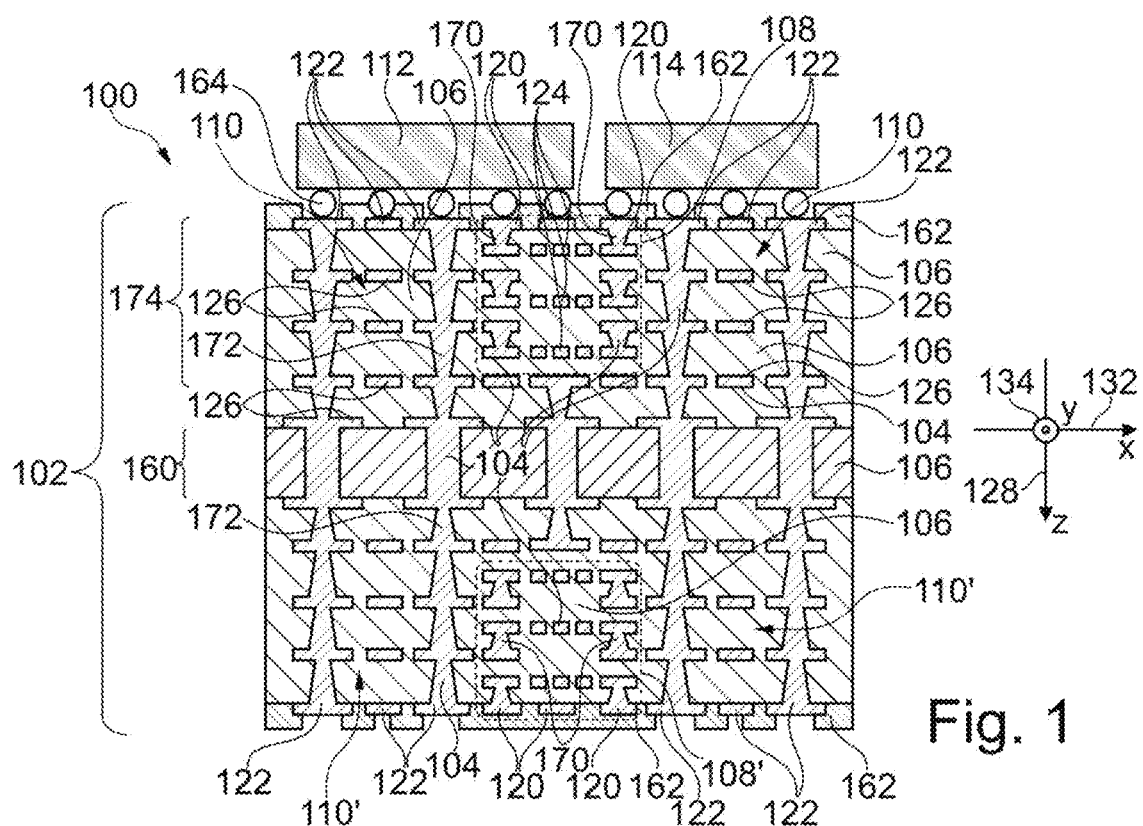
FIG. 1 illustrates a cross-sectional view of a component carrier according to an exemplary embodiment of the invention.

The illustrations in the drawings are schematically presented. In different drawings, similar or identical elements are provided with the same reference signs.

Before, referring to the drawings, exemplary embodiments will be described in further detail, some basic considerations will be summarized based on which exemplary embodiments of the invention have been developed.

According to an exemplary embodiment of the invention, a (for example PCB-type or IC substrate-type) component carrier is provided which has a (preferably laminated) layer stack with multiple electrically conductive layer structures. These electrically conductive layer structures may be configured for providing both a higher density connection region and a lower density connection region, the latter having a smaller number of electrically conductive elements of the electrically conductive layer structures per area or volume than the former. Two or more surface mounted components (such as semiconductor chips) may be electrically interconnected with each other by the higher density connection region. More specifically, an electrically conductive connection path may be established from one of said components via (in particular only) the higher density connection region to the other of said components. Preferably but not mandatory, said connection path does not extend through the lower density connection region to be as short as possible. To put it shortly, an intermediate layer or layer structure or stack portion may be configured as higher density connection region having a locally higher density of electrically conductive elements than a remaining lower density connection region of the stack. Such a region with locally increased density of electrically conductive elements in the layer stack may be integrated in a substrate stack having an ordinary or lower density of electrically conductive elements apart from the stack portion with locally increased integration density.

Exemplary embodiments of the invention have advantages. In particular, the concept of a locally increased integration density for connecting surface mounted components may be compatible with a manufacture of component carriers on panel level, in particular with large panel size. Furthermore, finer line features may become possible on a small area compared to a large panel. For manufacturing a higher density connection region, it is optionally possible to execute an additive process. Furthermore, the described manufacturing concept may lead to component carriers having a higher reliability compared with conventional approaches. Moreover, the combination of surface mounting components with the provision of a local higher density connection region in a stack may allow an improved registration compared to embedding concepts. Highly advantageously, a component carrier with low warpage may be obtained when using homogeneous material in the higher density connection region and the lower density connection region, in particular when using homogeneous dielectric material. Furthermore, the described manufacturing architecture is properly compatible with the manufacture of coreless component carriers. For instance, the higher density connection region may be formed based on ultrathin build up layers (for example extremely thin resin or prepreg layers). Since there may be less image transfer and a smaller number of process stages in comparison with conventional approaches, the manufacturing effort may be reduced. Furthermore, the provision of a higher density connection region being homogeneously integrated in a layer stack comprising a lower density connection region as well may make it dispensable to provide a bridge die, patch redistribution layers or other corresponding measures which may be conventionally used for interconnecting surface mounted components. Furthermore, the surface mounting architecture of exemplary embodiments may render it dispensable to carry out an embedding process. Further advantages are a higher reliability, less warpage, an improved signal by selecting an appropriate dielectric material, etc.

Exemplary applications of exemplary embodiments of the invention are high performance computing applications, server/cloud applications, chiplets, advanced driver assistance systems, and modules or packages involving artificial intelligence (AI).

FIG. 1 illustrates a cross-sectional view of a component carrier 100 according to an exemplary embodiment of the invention.

The component carrier 100 according to FIG. 1 may be a substantially plate-shaped IC (integrated circuit) substrate or a printed circuit board (PCB). Thus, the component carrier 100 shown in FIG. 1 may be highly compact in a vertical direction. More specifically, the component carrier 100 may comprise a stack 102 comprising electrically conductive layer structures 104 and electrically insulating layer structures 106. The electrically conductive layer structures 104 may comprise patterned metal layers (such as patterned copper foils or patterned deposited copper layers) and vertical through connections, for example copper filled vias, which may be created by drilling and plating. The electrically insulating layer structures 106 may comprise a respective resin (such as a respective epoxy resin), preferably comprising reinforcing particles therein (for instance glass fibers or glass spheres). For instance, the electrically insulating layer structures 106 may be made of FR4. The electrically insulating layer structures 106 may also comprise resin layers being free of glass fibers.

The electrically conductive layer structures 104 comprise a higher density connection region 108, a further higher density connection region 108', a lower density connection region 110, and a further lower density connection region 110'.

The further higher density connection region 108' is spatially separated from the higher density connection region 108 in a stack thickness direction 128 by a core 160 and by portions of the lower density connection regions 110, 110'. However, in other embodiments core 160 may be substituted by a dielectric multilayer. In a coreless embodiment (which may be implemented with or without embedding of components), the manufacturing process may omit a core and may start with any sacrificial carrier, for example a glass plate. In particular, an exemplary embodiment may provide a coreless component carrier 100 with an even number of layers, i.e., with a symmetrical configuration.

For example, the further higher density connection region 108' is electrically decoupled from the higher density connection region 108. The number of electrically conductive elements of the electrically conductive layer structures 104 per volume of stack material is larger in each of the higher density connection region 108 and the further higher density connection region 108' as compared with each of the lower density connection region 110 and the further lower density connection region 110'.

Stack 102 comprises the central core 160 which may be made of a fully cured resin (such as an epoxy resin) having reinforcing particles (such as glass fibers) therein. Vertical through connections of the electrically conductive layer structures 104 extend through the core 160 and electrically connect stack portions on both opposing main surfaces of the core 160 with each other. The higher density connection structures 108, 108' are provided on two opposing sides of the core 160. Each of the higher density connection structures 108, 108' is exposed at a respective one of opposing main surfaces of stack 102. On each side of core 160, the respective higher density connection structure 108, 108' is located in a horizontally central and vertically exterior portion of the stack 102. While each of the higher density connection structures 108, 108' is substantially rectangular in the cross-sectional view according to FIG. 1, each of the lower density connection structure 110, 110' is substantially U-shaped and surrounds the respectively assigned higher density connection structure 108, 108'.

As shown in FIG. 1 as well, each of the opposing main surfaces of the stack 102 is covered with a patterned electrically insulating solder resist 162. Solder resist 162 (which may also be denoted as solder mask) may be a thin lacquer-like layer of polymer that may be applied to exposed copper traces of the electrically conductive layer structures 104 for protection against oxidation and/or corrosion and to prevent solder bridges from forming between closely spaced solder pads (see solder-type electrically conductive connection structures 164 described below).

FIG. 1 shows a first component 112 and a second component 114 both being surface-mounted on the upper main surface of the stack 102. For example, first component 112 is a first semiconductor chip embodied as processor. For instance, the second component 114 is a second semiconductor chip configured as memory. The first component 112 and the second component 114 may be naked dies or may be encapsulated, for instance molded. As illustrated, each of the first component 112 and the second component 114 is surface mounted partially on the higher density connection structure 108 and partially on the lower density connection structure 110. More specifically, each of the first component 112 and the second component 114 has a plurality of electrically conductive pads (not shown in FIG. 1) on a respective main surface thereof. Said pads are electrically coupled via electrically conductive connection structures 164 with connection elements 120 on the top side of the higher density connection structure 108 and with further connection elements 122 on the top side of the lower density connection structure 110. For example, the connection structures 164 may be solder structures, such as solder balls or solder paste. Alternatively, sinter structures, electrically conductive glue and/or metallic pillars (for example copper pillars) may be used for accomplishing such an electric connection. Advantageously, some pads of the first component 112 and some pads of the second component 114 are electrically coupled with each other directly by the higher density connection region 108. Other pads of the first component 112 and other pads of the second component 114 are coupled with electrically conductive layer structures 104 of the lower density connection structure 110 and of the further lower density connection structure 110' by vertically stacked vias, as shown in FIG. 1. It is also possible that said other pads of components 112, 114 are electrically coupled with each other by the lower density connection structure 110.

No components are surface mounted on the lower main surface of stack 102 according to FIG. 1. Thus, component carrier 100 can be mounted at its bottom side, for instance by a further solder structure (not shown), on a mounting base, such as a printed circuit board (also not shown). It is also possible that additional components are surface mounted on the bottom main surface of the component carrier 100 (not shown as well).

Each of said higher density connection regions 108, 108' extends up to an exterior main surface of the stack 102 so as to be easily connectable with a surface mounted component 112, 114.

Advantageously, by the direct coupling of some of the pads of the first component 112 with some of the pads of the second component 114 directly through the higher density connection structure 108, a very short electric connection path between the surface mounted components 112, 114 may be obtained. This keeps ohmic losses of electric signals small, which signals may propagate between said pads of the components 112, 114. Consequently, a high signal quality and a high signal amplitude of the electric signals may be obtained. At the same time, the additional manufacturing effort of embedding the components 112, 114 may be avoided. Also, additional members or inlays, such as bridge dies or silicon interposers, may be not needed for the purpose of connecting the components 112, 114 in view of the illustrated assembly architecture.

As already mentioned above, the number of electrically conductive elements of the electrically conductive layer structures 104 per volume or per area may be larger in the respective higher density connection region 108, 108' than in the respective lower density connection region 110, 110'. In other words, the integration density may be higher in the respective higher density connection region 108, 108' in comparison with the respective lower density connection region 110, 110'. In this context, the term "density", in particular "integration density", may denote a number of electrically conductive elements (in particular trace elements (such as wiring structures, which may belong to planar layer sections 124, 126), connection elements 120, 122 (such as pads) and/or vertical through connections 170, 172 (such as metallic vias)) per area or volume of the respective connection region 108, 108', 110, 110'. Hence, the amount of electrically conductive elements in a higher density connection region 108, 108' may be higher than the amount of electrically conductive elements in a lower density connection region 110, 110'. Thus, integration density may mean a quantity of electrically conductive elements per area or volume. The integration density in a lower density connection region 110, 110' can be less than in a higher density connection region 108, 108'. Correspondingly, the line space ratio and/or line pitch may be higher in a lower density connection region 110, 110' than in a higher density connection region 108, 108'. Since manufacture of a connection region with high integration density may involve a larger effort than manufacture of a connection region with low integration density, it is advantageous when a high integration density is only manufactured in the stack where needed from a functional point of view. In other portions of the stack in which a low integration density is sufficient for fulfilling a desired function, a simplified manufacturing process can be carried out.

More specifically, the higher connection density of the respective higher density connection region 108, 108' compared with the lower connection density of the respective lower density connection region 110, 110' may correspond to a smaller line pitch of the respective higher density connection region 108, 108' compared to a higher line pitch of the respective lower density connection region 110, 110'. For instance, a line pitch of trace elements of the planar layer sections 124 in the respective higher density connection region 108, 108' may be 5 μm. In contrast to this, a line space ratio of trace elements of the planar layer sections 126 in the respective lower density connection region 110, 110' may be for example 20 μm. In relative terms, a ratio between an average line width of trace elements of the planar layer sections 124 in the respective higher density connection region 108, 108' and of trace elements of the planar layer sections 126 in the lower density connection regions 110, 110' may be for example 1/10. It is also possible that a ratio between an average line space of trace elements of the planar layer sections 124 in the higher density connection regions 108, 108' and of trace elements of the planar layer sections 124 in the lower density connection regions 110, 110' is for instance 1/10.

According to a preferred embodiment, the higher density connection regions 108, 108' and the lower density connection regions 110, 110' are homogeneously integrated within the same electrically insulating layer structures 106 of the stack 102. Preferably, the lower density connection regions 110, 110' and the higher density connection regions 108, 108' do not have a dielectric interface in between. In contrast to this, a transition of the dielectric material between a respective one of the lower density connection regions 110, 110' and a respective one of the higher density connection regions 108, 108' may be continuous and without dielectric material bridge. According to such an embodiment, the dielectric matrix of both the higher density connection regions 108, 108' and the lower density connection regions 110, 110' are continuous. In particular, no dielectric material bridge is present as transitions between the higher density connection regions 108, 108' and the lower density connection regions 110, 110'. This is a result of the fact that, according to FIG. 1, the higher density connection regions 108, 108' and the lower density connection regions 110, 110' are manufactured by a common build-up of electrically conductive layer structures 104 and electrically insulating layer structures 106, rather than manufacturing a respective one of the higher density connection regions 108, 108' as an inlay and inserting them into cavities of a respective one of the lower density connection regions 110, 110'. For example, each electrically insulating layer structure 106 of the component carrier 100 may be a substantially planar horizontal layer of continuous dielectric material (for example resin, optionally comprising reinforcing particles) which extends in a homogeneous way over a respective higher density connection region 108, 108' and a respective lower density connection region 110, 110'. By avoiding dielectric material bridges between the higher density connection regions 108, 108' and the lower density connection regions 110, 110', CTE mismatch in between may be avoided. As a result, undesired phenomena such as delamination or warpage of the component carrier 100 may be reliably prevented.

As already mentioned, the electrically conductive layer structures 104 comprise pad-type connection elements 120 in the respective higher density connection region 108, 108' and further pad-type connection elements 122 in the respective lower density connection region 110, 110'. In view of the different integration densities in the different stack portions, the connection elements 120 are smaller than the further connection elements 122. As shown, said connection elements 120 and said further connection elements 122 extend up to a respective exterior main surface of the stack 102. This allows an electric connection between said pads and surface mounted components 112, 114.

Moreover, the electrically conductive layer structures 104 comprise the above-mentioned parallel planar layer sections 124 in each higher density connection region 108, 108' and parallel planar further layer sections 126 in each lower density connection region 110, 110'. As shown in FIG. 1, some of said layer sections 124 extend between two adjacent ones of said further layer sections 126 in a vertical stack thickness direction 128. In a stack portion 174 over which the higher density connection structure 108 extends in a vertical direction according to FIG. 1, the higher density connection structure 108 has seven structured horizontal electrically conductive layers, whereas the lower density connection structure 108 has only four structured horizontal electrically conductive layers within the vertical extension of stack portion 174. Still referring to FIG. 1, some of the intermediate layer sections 124 of high-density connection structure 108 extend vertically displaced with respect to corresponding layer sections 126 of lower density connection structure 110, whereas others of the intermediate layer sections 124 of high-density connection structure 108 are horizontally aligned with respect to corresponding other layer sections 126 of lower density connection structure 110.

In the embodiment of FIG. 1, the electrically conductive layer structures 104 in the higher density connection regions 108, 108' and in the lower density connection regions 110, 110' comprise electrically conductive elements spaced with respect to each other in the vertical stack thickness direction 128, electrically conductive elements spaced with respect to each other in a first horizontal or lateral direction 132 perpendicular to the stack thickness direction 128, and electrically conductive elements spaced with respect to each other in a second horizontal or lateral direction 134 perpendicular to the stack thickness direction 128 and perpendicular to the first lateral direction 132. In the shown embodiment, the higher integration density in the respective higher density connection region 108, 108' with regard to a lower integration density in the respective lower density connection region 110, 110' is present in each of the three mutually perpendicular spatial directions 128, 132, 134. In other embodiments, the higher integration density of a higher density connection region 108, 108' in comparison with the lower integration density of a lower density connection region 110, 100' may be present only in one of the spatial directions 128 or 132 or 134 or in two spatial directions 128 and 132, 128 and 134, or 132 and 134.

Since the layer stack 102 is symmetric according to FIG. 1, i.e., has substantially the same build-up on both opposing main surfaces of core 160, mechanical and thermal stress may be kept small. As a consequence, phenomena such as warpage and delamination may be further suppressed.

Figure 2:
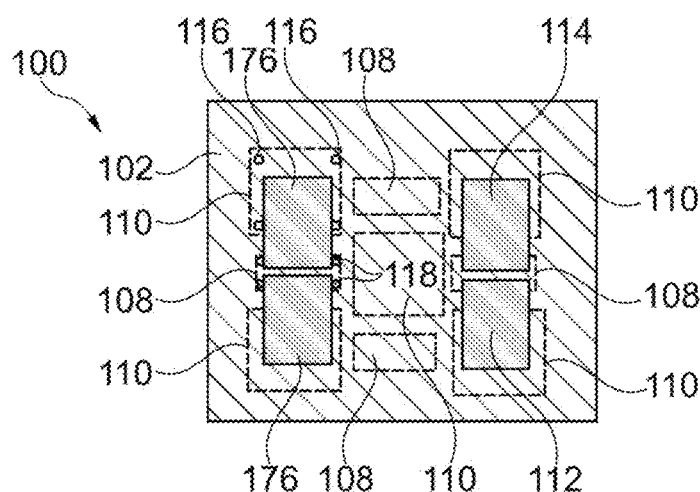
FIG. 2 illustrates a schematic plan view of the component carrier according to FIG. 1.

FIG. 2 shows a plan view of the component carrier 100 according to FIG. 1 in a schematic illustration.

The example of FIG. 2 shows that any desired arrangement of higher density connection regions 108 and lower density connection regions 110 can be freely designed in accordance with the requirements of a certain application. FIG. 2 also shows that additional components 176 may be surface mounted on stack 102. Although not shown, other embodiments may also comprise one or more components being embedded in stack 102.

Advantageously, the embodiment of FIG. 1 and FIG. 2 comprises a number of localized high-density layers integrated into a substrate-type stack 102. Such local high-density layers may form one or more higher density connection regions 108. In contrast to this, lower density connection regions 110 may be manufactured as standard build-up layers.

FIG. 2 illustrates an additional advantageous feature of exemplary embodiments of the invention: According to FIG. 2, component carrier 100 comprises a first set of first alignment marks 116 assigned to the lower density connection region 110. Furthermore, component carrier 100 comprises a second set of second alignment marks 118 assigned to the higher density connection region 108. This may make it possible be align the high-density area to the low-density area and/or assemble components (see for example reference signs 112, 114) or additional component 176 with high accuracy. For instance, the alignment marks 116, 118 may be copper structures or holes in stack 102.

FIG. 3 to FIG. 10 illustrate cross-sectional views of structures obtained during carrying out a method of manufacturing a component carrier 100, shown in FIG. 1, according to an exemplary embodiment of the invention.

Figure 3:
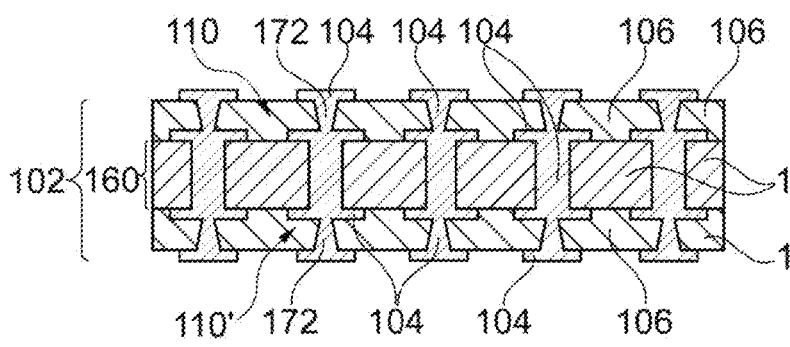
FIG. 3, FIG. 4, FIG. 5, FIG. 6, FIG. 7, FIG. 8, FIG. 9 and FIG. 10 illustrate cross-sectional views of structures obtained during carrying out a method of manufacturing a component carrier, shown in FIG. 1, according to an exemplary embodiment of the invention.

Referring to FIG. 3, core 160 may be covered on both opposing main surfaces thereof with electrically conductive layer structures 104 (in particular made of copper) and electrically insulating layer structures 106 (for instance made of prepreg or FR4). The structure shown in FIG. 3 may have a relatively low integration density, for instance in accordance with a line space ratio of 9 µm/12 µm.

Figure 4:
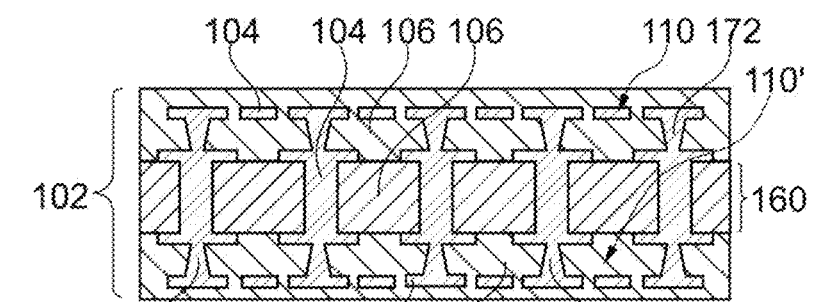

In order to obtain the structure shown in FIG. 4, additional electrically insulating layer structures 106 may be laminated on both opposing main surfaces of the structure shown in FIG. 3.

Figure 5:
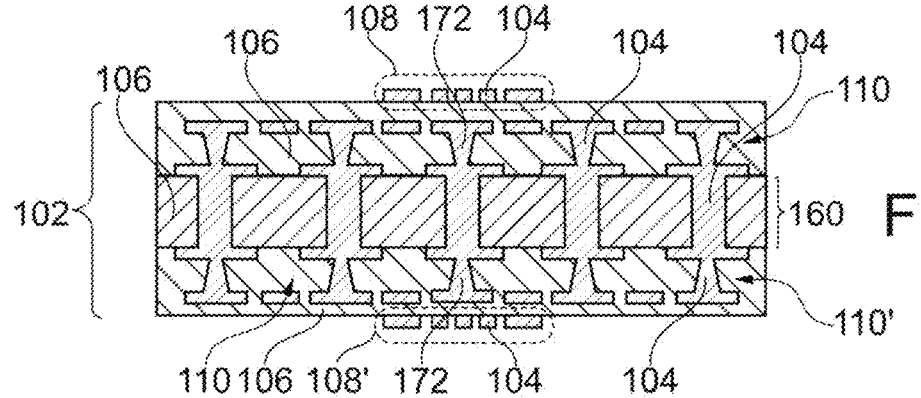

Referring to FIG. 5, formation of higher density connection regions 108, 108' on both opposing main surfaces of the structure shown in FIG. 4 starts. Hence, FIG. 5 relates to the local application of high-density regions, preferably full additive structures. For instance, correspondingly formed high density layers may for example have a line space ratio of 2 µm/2 µm. For this purpose, an electrically conductive layer may be attached or laminated on both opposing main surfaces of the structure of FIG. 4 and may then be patterned to form a structure with high integration density in a central portion of both opposing main surfaces of the stack 102.

Figure 6:
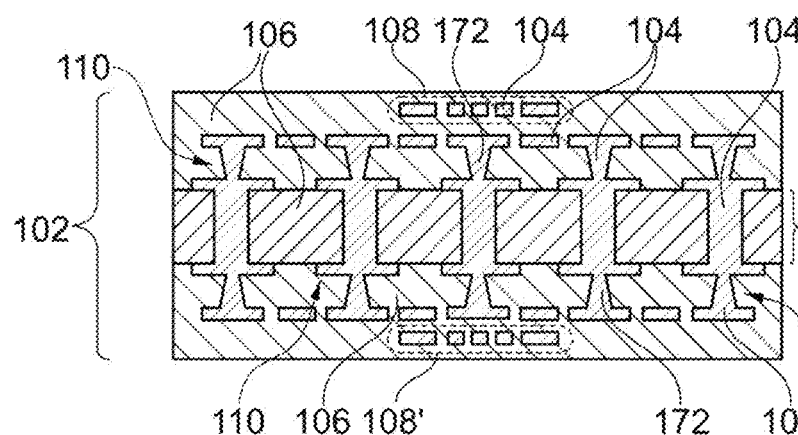

In order to obtain the structure shown in FIG. 6, additional electrically insulating layer structures 106 may be laminated on both opposing main surfaces of the structure shown in FIG. 5.

Figure 7:
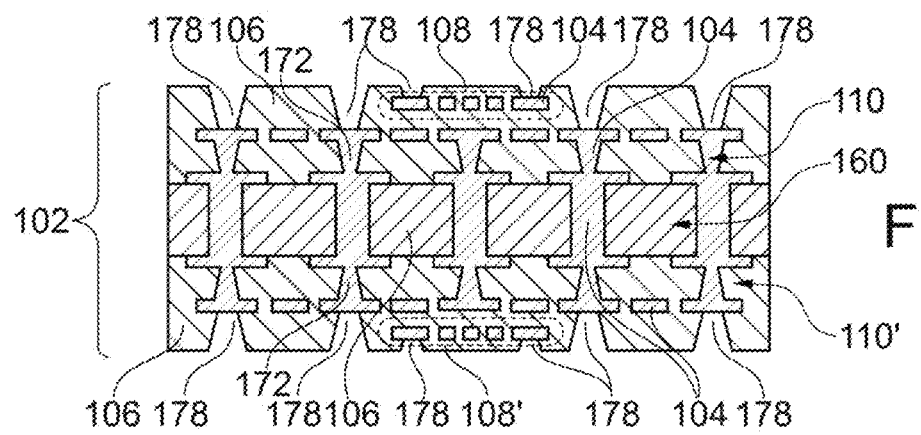

In order to obtain the structure shown in FIG. 7, said additional electrically insulating layer structures 106 may be patterned on both opposing main surfaces of the structure shown in FIG. 6. The patterning can be carried out to form access holes 178 for exposing electrically conductive layer structures 104 on both opposing main surfaces of the stack 102. More specifically, electrically conductive layer structures 104 are exposed for the higher density connection regions 108, 108' and for the lower density connection regions 110, 110'. Said layer opening process may be carried out for example by a laser, a plasma, or a photo via process.

Figure 8:
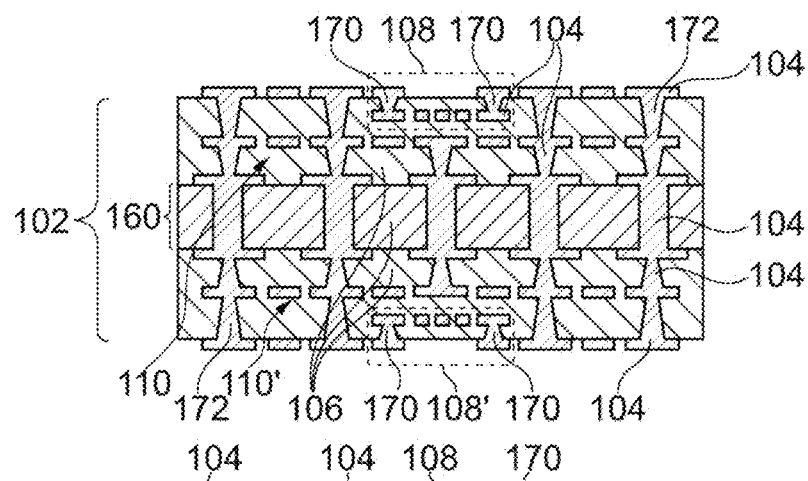

Referring to FIG. 8, the excess holes 178 are filled with an electrically conductive material (such as copper). In addition, the exposed opposing main surfaces of stack 102 are covered by electrically conductive material as well. For example, said electrically conductive material may be applied by plating. Thereafter, the obtained metal layer may be patterned.

Figure 9:
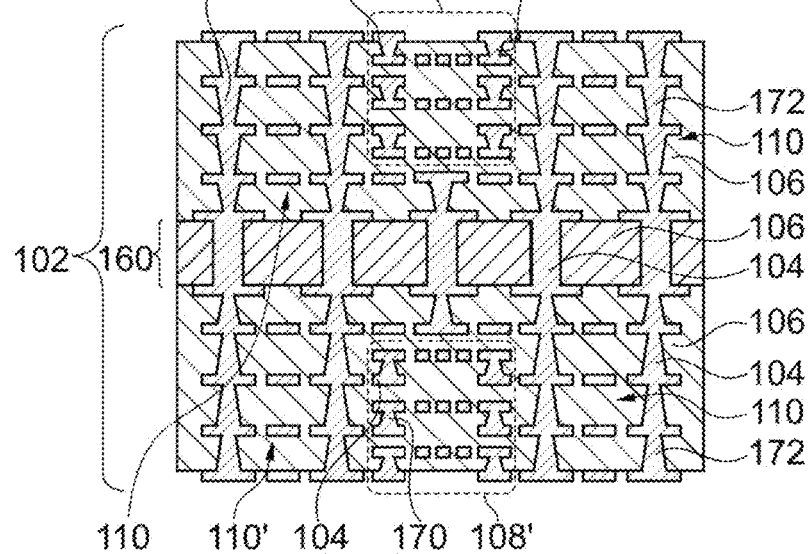

In order to obtain the structure shown in FIG. 9, the process according to FIG. 4 to FIG. 8 may be repeated a desired number of times (for instance twice), until a desired build up is obtained.

Figure 10:
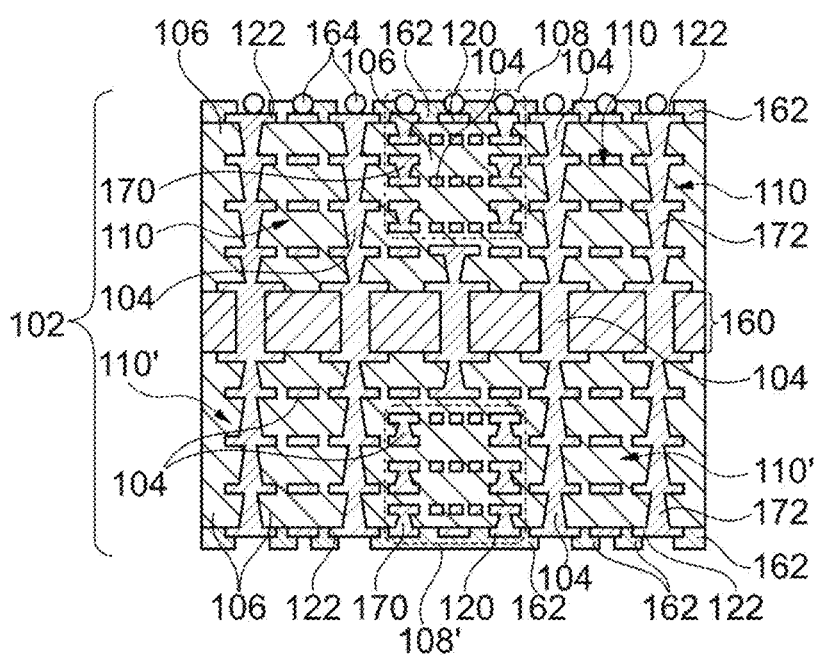

Referring to FIG. 10, a backend process may be carried out. For example, a solder resist 162 and a surface finish (not shown) may be applied. Furthermore, an electrically conductive connection structure 164 may be applied, for instance solder balls, copper pillars, etc.

Thereafter, components 112, 114 may be surface mounted on the upper main surface of the structure shown in FIG. 10 to obtain component carrier 100 according to FIG. 1.

Figure 11:
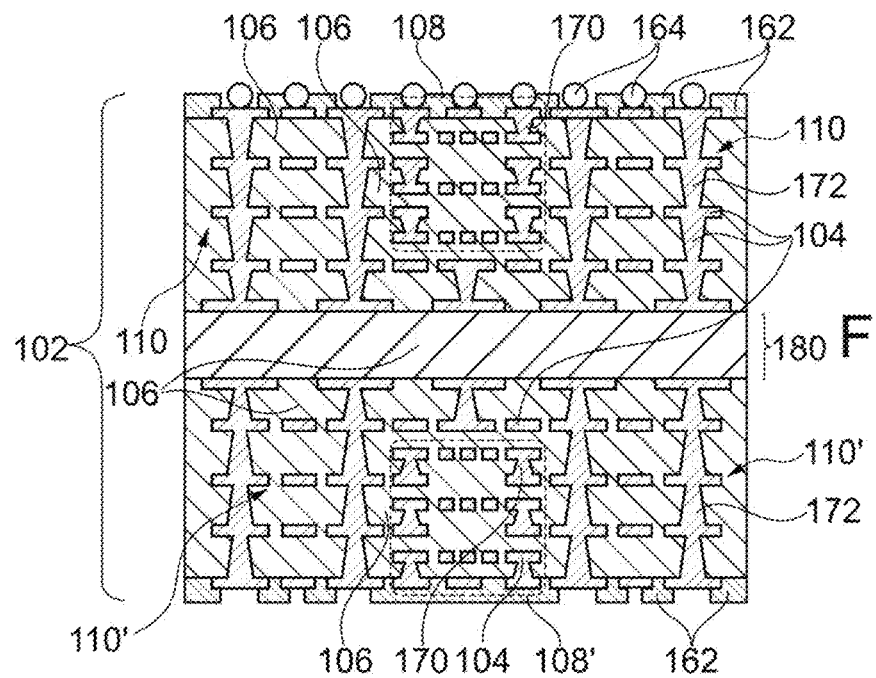
FIG. 11 and FIG. 12 illustrate cross-sectional views of structures obtained during carrying out a method of manufacturing component carriers, shown in FIG. 12, according to an exemplary embodiment of the invention.
Figure 12:
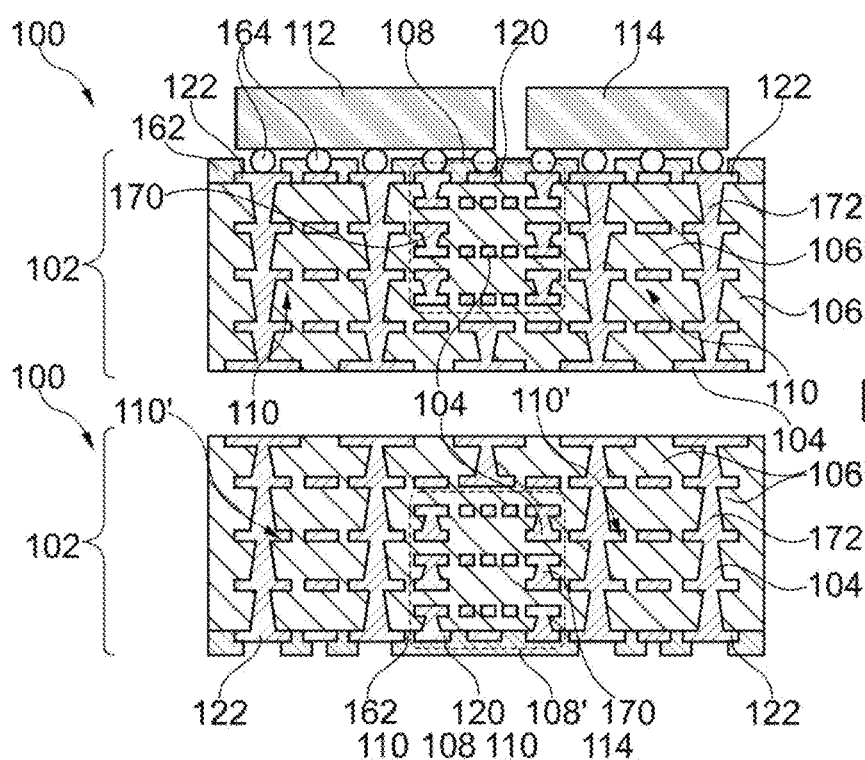
Figure 13:
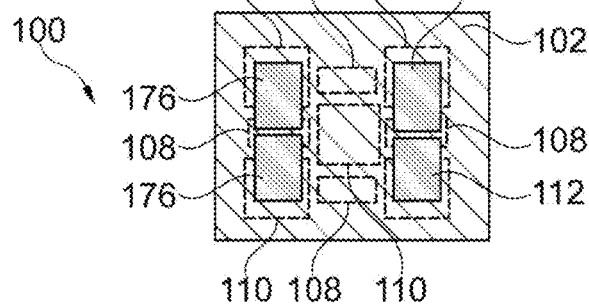
FIG. 13 illustrates a plan view of a component carrier according to FIG. 12.

FIG. 11 and FIG. 12 illustrate cross-sectional views of structures obtained during carrying out a method of manufacturing component carriers 100, shown in FIG. 12, according to another exemplary embodiment of the invention. FIG. 13 illustrates a plan view of a component carrier 100 according to FIG. 12.

The embodiment of FIG. 11 and FIG. 12 relates to the manufacture of coreless component carriers 100. Thus, core 160 is substituted by a temporary carrier 180 which may be removed prior to completing manufacture of the component carriers 100. After the manufacturing process, see FIG. 12, a first component carrier 100 (on a top side) and a second component carrier 100 (at a bottom side) may be removed from the temporary carrier 180. The result of this manufacturing method are two component carriers 100 with asymmetric buildup.

Figure 14:
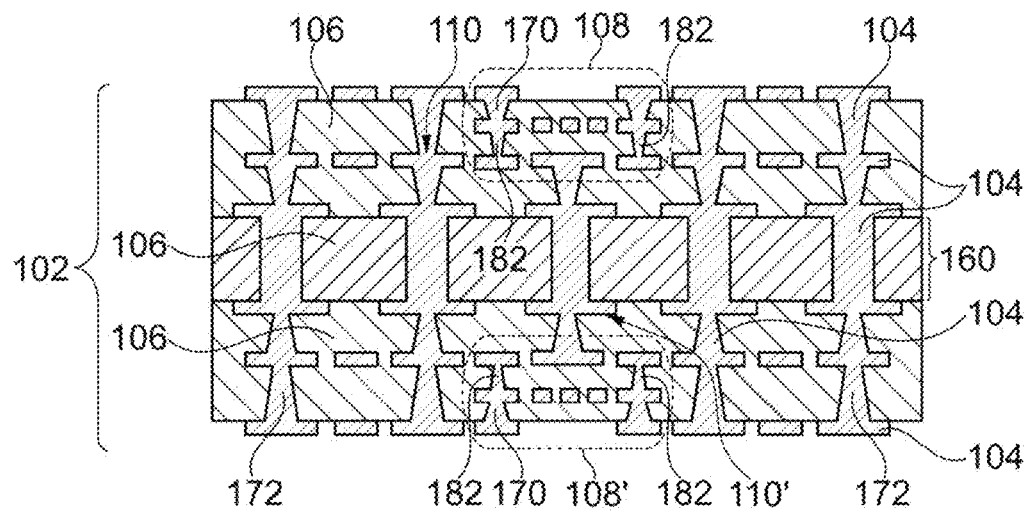
FIG. 14, FIG. 15, and FIG. 16 illustrate cross-sectional views and a schematic plan view of structures obtained during carrying out methods of manufacturing component carriers according to exemplary embodiments of the invention.
Figure 15:
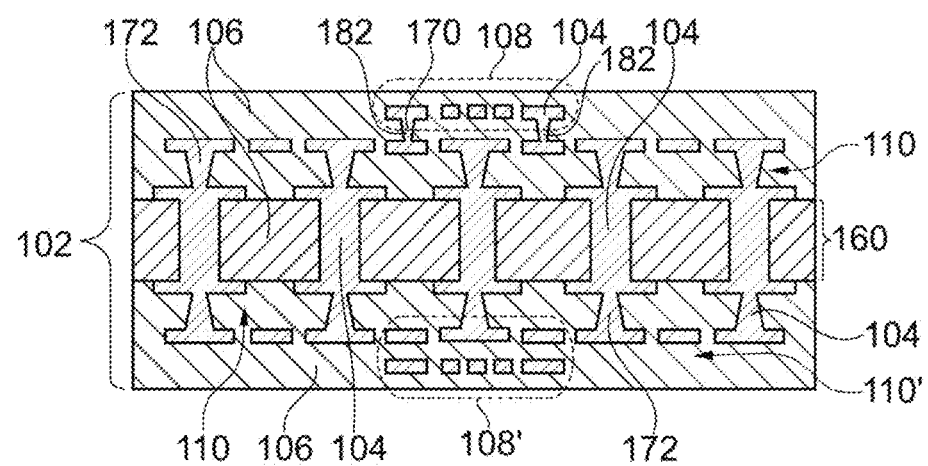
Figure 16:
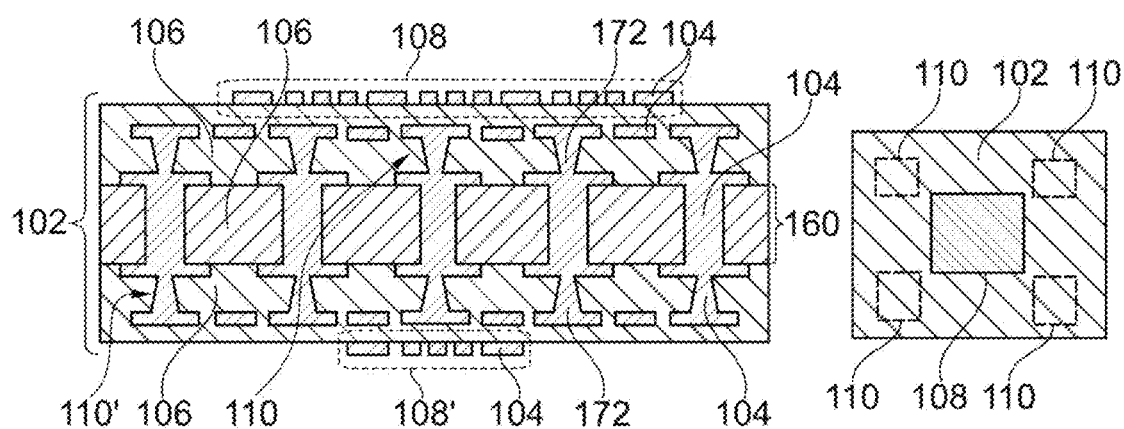

FIG. 14 to FIG. 16 illustrate cross-sectional views and a plan view of structures obtained during carrying out methods of manufacturing component carriers 100 according to exemplary embodiments of the invention. To put it shortly, several variants compared with the above-described embodiments are described referring to FIG. 14 to FIG. 16.

A difference between the embodiment according to FIG. 14 and the embodiment according to FIG. 8 is that, according to FIG. 14, additional electrically conductive layer structures 182 are created in the higher density connection regions 108, 108' for electrically connecting the higher density connection regions 108, 108' with each other. For instance, the additional electrically conductive layer structures 182 are copper filled laser vias. Thus, a direct laser connection between high density layers may be achieved according to FIG. 14. In other words, the further higher density connection region 108' is electrically coupled with the higher density connection region 108 by the additional electrically conductive layer structures 182.

A difference between the embodiment according to FIG. 15 and the embodiment according to FIG. 5 is that, according to FIG. 15, additional electrically conductive layer structures 182 are created only in the higher density connection region 108 for electrically connecting the higher density connection region 108 with only part of further higher density connection region 108'.

A difference between the embodiment according to FIG. 16 and the embodiment according to FIG. 6 is that, according to FIG. 16, the higher density connection region 108 it is formed with a larger lateral extension than the further higher density connection region 108'. In other words, an extension of the higher density connection region 108 in a horizontal plane may be larger than an extension of the further higher density connection region 108' in the horizontal plane. The fact that higher density connection region 108 is formed with increased two-dimensional extension can also be taken from a plan view on the right-hand side of FIG. 16. For instance, an interposer function may be integrated in the larger area of the high-density layer of higher density connection region 108.

Figure 17:
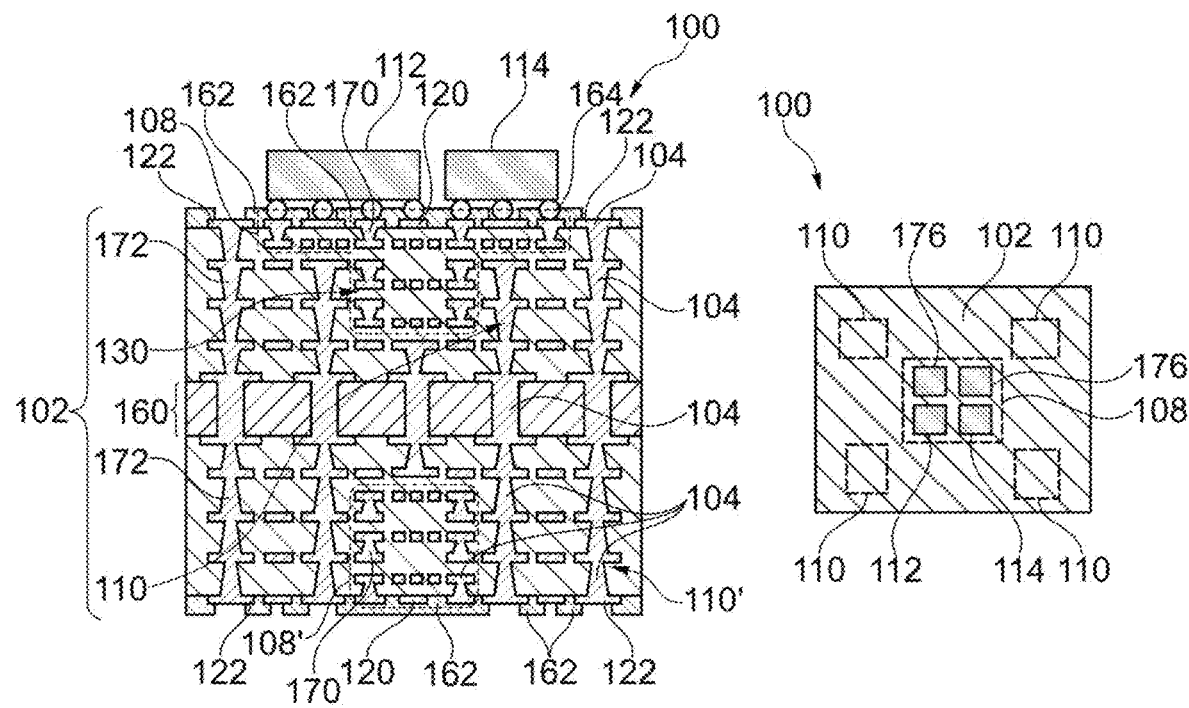
FIG. 17 illustrates a cross-sectional view and a schematic plan view of a component carrier according to an exemplary embodiment of the invention.

FIG. 17 illustrates a cross-sectional view and a plan view of a component carrier 100 according to another exemplary embodiment of the invention. Component carrier 100 according to FIG. 17 also has a higher density connection region 108 having a high-density layer with high spatial extension. Together with additional high-density layers having a smaller spatial extension, the higher density connection region 108 according to FIG. 17 can provide a redistribution structure 130. As can be taken from FIG. 17, such a higher density connection region 108 may have a substantially T-shape in a cross-sectional view. In contrast to this, the further higher density connection region 108' of FIG. 17 has a substantially rectangular shape.

Figure 18:
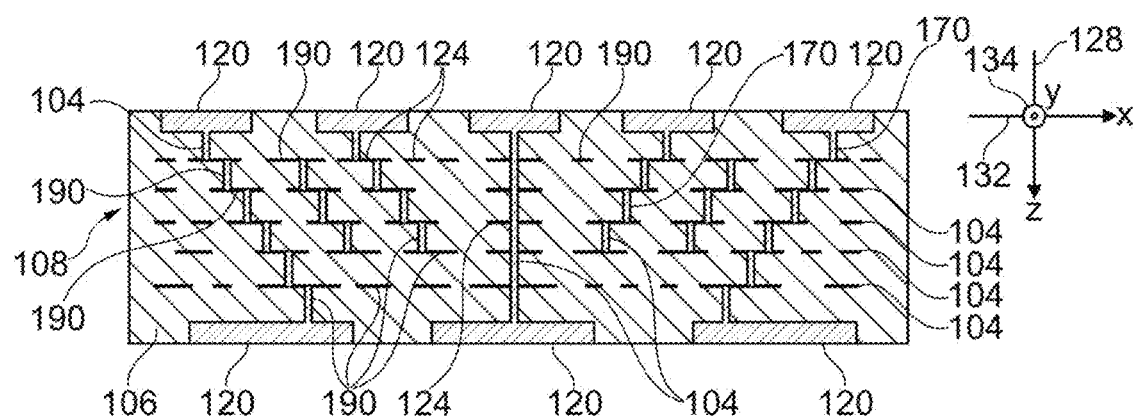
FIG. 18 illustrates a cross-sectional view of a high-density connection region of a component carrier according to an exemplary embodiment of the invention.

FIG. 18 illustrates a cross-sectional view of a higher density connection region 108 of a component carrier 100 according to still another exemplary embodiment of the invention. Although shown separately in FIG. 18, the illustrated higher density connection region 108 may be homogeneously integrated in an organic layer stack 102 of a component carrier 100, as described above.

FIG. 18 shows that the electrically conductive layer structures 104 in the higher density connection region 108 may comprise a plurality of electrically conductive elements 190 spaced with respect to each other in a stack thickness direction 128. Furthermore, the illustrated higher density connection region 108 comprises a plurality of electrically conductive elements 190 spaced with respect to each other in a first lateral direction 132 perpendicular to the stack thickness direction 128. Moreover, the shown higher density connection region 108 comprises a plurality of electrically conductive elements 190 spaced with respect to each other in a second lateral direction 134 perpendicular to the stack thickness direction 128 and perpendicular to the first lateral direction 132. Some or all of said electrically conductive elements 190 may be electrically connected with a respective other part of said electrically conductive elements 190 in the stack thickness direction 128 and in both the first lateral direction 132 and the second lateral direction 134. The increased integration density of the higher density connection region 108 shown in FIG. 18 may be larger than the integration density of a corresponding lower density connection region 110 (not shown in FIG. 18) in the stack thickness direction 128 and/or in the first lateral direction 132 and/or in the second lateral direction 134.

In certain embodiments, an average distance between adjacent ones of said electrically conductive elements 190 in the first lateral direction 132 may be different from an average distance between adjacent ones of said electrically conductive elements 190 in the second lateral direction 134 and/or in the stack thickness direction 128. Additionally or alternatively, an average distance between adjacent ones of said electrically conductive elements 190 in the second lateral direction 134 may be different from an average distance between adjacent ones of said electrically conductive elements 190 in the stack thickness direction 128.

It should be noted that the term "comprising" does not exclude other elements or steps and the article "a" or "an" does not exclude a plurality. Also, elements described in association with different embodiments may be combined.

Implementation of the invention is not limited to the preferred embodiments shown in the figures and described above. Instead, a multiplicity of variants is possible which use the solutions shown and the principle according to the invention even in the case of fundamentally different embodiments.

The invention claimed is:
1. A component carrier, comprising:
a stack comprising electrically conductive layer structures and at least one electrically insulating layer structure, wherein the electrically conductive layer structures comprise a higher density connection region and a lower density connection region and wherein the higher density connection region and the lower density connection region are formed as a build-up of laminated layers; and
a first component and a second component which are surface mounted on the stack;

wherein the first component and the second component are electrically coupled with each other by the higher density connection region, wherein the electrically conductive layer structures comprise parallel planar layer sections in the higher density connection region and further parallel planar layer sections in the lower density connection region, wherein at least one of the parallel planar layer sections extends between two adjacent ones of the further parallel planar layer sections in a stack thickness direction.

2. The component carrier according to claim 1, wherein a higher connection density of the higher density connection region compared with a lower connection density of the lower density connection region corresponds to a smaller line space ratio and/or a smaller line pitch of the higher density connection region compared to a higher line space ratio and/or a higher line pitch of the lower density connection region.

3. The component carrier according to claim 1, wherein a line pitch of the higher density connection region is in a range from 0.4 µm to 10 µm.

4. The component carrier according to claim 1, wherein a line pitch of the lower density connection region is in a range from 10 µm to 40 µm.

5. The component carrier according to claim 1, comprising at least one of the following features:
   wherein a ratio between an average line width in the higher density connection region and in the lower density connection region is in a range from 1/50 to 1/5;
   wherein a ratio between an average line space in the higher density connection region and in the lower density connection region is in a range from 1/50 to 1/5;
   wherein at least one of the first component and the second component comprises a processor chip;
   wherein at least one of the first component and the second component comprises a memory chip;
   wherein the higher density connection region and the lower density connection region are homogeneously integrated within the same at least one electrically insulating layer structure of the stack;
   wherein the lower density connection region and the higher density connection region are free of a dielectric interface in between;
   a first set of first alignment marks assigned to the lower density connection region;
   a second set of second alignment marks assigned to the higher density connection region.

6. The component carrier according to claim 1, wherein the electrically conductive layer structures comprise connection elements in the higher density connection region and further connection elements in the lower density connection region, said connection elements being smaller than said further connection elements.

7. The component carrier according to claim 6, wherein at least part of said connection elements and/or at least part of said further connection elements extend up to an exterior main surface of the stack.

8. The component carrier according to claim 1, wherein said higher density connection region extends up to an exterior main surface of the stack.

9. The component carrier according to claim 1, wherein at least two of said layer sections extend between two adjacent ones of said further layer sections in the stack thickness direction.

10. The component carrier according to claim 1, wherein at least one of said parallel planar layer sections extends, with respect to the stack thickness direction, at the same level as or below an exterior one of said parallel planar further layer sections.

11. The component carrier according to claim 1, wherein the higher density connection region comprises a redistribution structure.

12. The component carrier according to claim 1, comprising one of the following features:
   the higher density connection region has a substantially rectangular shape in a cross-sectional view and/or in a top view;
   the higher density connection region has a substantially T-shape in a cross-sectional view.

13. The component carrier according to claim 1, further comprising:
   a further higher density connection region being spatially separated from the higher density connection region.

14. The component carrier according to claim 13, comprising at least one of the following features:
   wherein the further higher density connection region is spatially separated from the higher density connection region in a stack thickness direction;
   wherein the further higher density connection region is electrically coupled with the higher density connection region;
   wherein the further higher density connection region is electrically decoupled from the higher density connection region.

15. The component carrier according to claim 1, wherein the electrically conductive layer structures in one or both of the higher density connection region and the lower density connection region comprise:
   at least two electrically conductive elements spaced with respect to each other in a stack thickness direction;
   at least two electrically conductive elements spaced with respect to each other in a first lateral direction perpendicular to the stack thickness direction; and
   at least two electrically conductive elements spaced with respect to each other in a second lateral direction perpendicular to the stack thickness direction and perpendicular to the first lateral direction.

16. The component carrier according to claim 15, wherein at least part of said electrically conductive elements is electrically connected with a respective other part of said electrically conductive elements in the stack thickness direction and/or in at least one of the first lateral direction and the second lateral direction.

17. The component carrier according to claim 15, comprising at least one of the following features:
   an average distance between adjacent ones of said electrically conductive elements in the first lateral direction is different from an average distance between adjacent ones of said electrically conductive elements in the second lateral direction and/or in the stack thickness direction;
   an average distance between adjacent ones of said electrically conductive elements in the second lateral direction is different from an average distance between adjacent ones of said electrically conductive elements in the stack thickness direction.

18. The component carrier according to claim 1, wherein an average distance between adjacent ones of said electrically conductive elements in the higher density connection region is smaller than an average distance between adjacent ones of said electrically conductive elements in the lower density connection region.

19. A method of manufacturing a component carrier, the method comprising:
- providing a stack comprising electrically conductive layer structures and at least one electrically insulating layer structure, wherein the electrically conductive layer structures comprise a higher density connection region and a lower density connection region and wherein the higher density connection region and the lower density connection region are formed as a build-up of laminated layers;
- surface-mounting a first component and a second component on the stack; and
- electrically coupling the first component and the second component with each other by the higher density connection region,
- wherein the electrically conductive layer structures comprise parallel planar layer sections in the higher density connection region and further parallel planar layer sections in the lower density connection region, wherein at least one of the parallel planar layer sections extends between two adjacent ones of the further parallel planar layer sections in a stack thickness direction.

* * * * *

UNITED STATES PATENT AND TRADEMARK OFFICE
CERTIFICATE OF CORRECTION

| | | |
|---|---|---|
| PATENT NO. | : 12,463,124 B2 | Page 1 of 1 |
| APPLICATION NO. | : 17/655160 | |
| DATED | : November 4, 2025 | |
| INVENTOR(S) | : Markus Leitgeb and Gerhard Freydl | |

It is certified that error appears in the above-identified patent and that said Letters Patent is hereby corrected as shown below:

On the Title Page

Item [73], delete "(AU)" and insert -- (AT) --.

Signed and Sealed this
Ninth Day of December, 2025

John A. Squires
*Director of the United States Patent and Trademark Office*